(12) United States Patent
Yamagishi et al.

(10) Patent No.: US 7,358,577 B2
(45) Date of Patent: Apr. 15, 2008

(54) HIGH VOLTAGE FIELD EFFECT TRANSISTOR

(75) Inventors: Masashi Yamagishi, Miyazaki (JP); Toshihiro Honma, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/819,983

(22) Filed: Jun. 29, 2007

(65) Prior Publication Data
US 2008/0042197 A1   Feb. 21, 2008

(30) Foreign Application Priority Data
Aug. 18, 2006   (JP)   ............... 2006-222964

(51) Int. Cl.
*H01L 29/78*   (2006.01)
(52) U.S. Cl. ............... 257/409; 257/E29.229
(58) Field of Classification Search ........... 257/409, 257/E29.229
See application file for complete search history.

(56) References Cited

U.S. PATENT DOCUMENTS 5,541,435 A * 7/1996 Beasom .............. 257/409
5,907,173 A * 5/1999 Kwon et al. ........... 257/336
6,160,290 A * 12/2000 Pendharkar et al. ..... 257/339
2007/0264785 A1 * 11/2007 Choi et al. ............ 438/297

FOREIGN PATENT DOCUMENTS

JP    2003-204062    7/2003

* cited by examiner

*Primary Examiner*—Evan Pert
(74) *Attorney, Agent, or Firm*—Rabin & Berdo, P.C.

(57) ABSTRACT

A high voltage field effect transistor according to the present invention has: a p-type low concentration drain region and a low concentration source region formed on both sides of a channel formation region within a n-type region of a semiconductor substrate; a high concentration drain region formed in the low concentration drain region, an impurity concentration of which is higher than that of the low concentration drain region; a gate insulating film that at least covers a surface of the channel formation region; a field oxide film formed on the low concentration drain region so as to be in contact with an end section of the gate insulating film; a gate electrode formed on said gate insulating film and at least a part of said field oxide film so as to cover an entire channel formation region and an end section of said low concentration drain region; and a non-oxide region of the low concentration drain region, on both sides of which there are the gate electrode and the high concentration drain region, and on a surface of which there are not formed the high concentration drain region and the field oxide film.

6 Claims, 5 Drawing Sheets

HIGH VOLTAGE FIELD EFFECT TRANSISTOR

CROSS REFERENCE TO RELATED APPLICATION

This application claims the priority of Application No. 2006-222964, filed Aug. 18, 2006 in Japan, the subject matter of which is incorporated herein by reference.

TECHNICAL FIELD OF THE INVENTION

The present invention relates to a high voltage (high-breakdown-voltage) field effect transistor and a manufacturing method thereof. The present invention can be applied for example to a HV-pMOS (High Voltage p-channel Metal Oxide Semiconductor; high voltage pMOS) transistor and to a manufacturing method thereof.

BACKGROUND OF THE INVENTION

As a high voltage field effect transistor, there is for example one disclosed in Japanese Unexamined Patent Publication No. 2003-204062.

For example as shown in FIG. 16 in the above patent Document, a high voltage nMOS transistor has a low concentration region (referred to as n-offset drain region 12 in this patent Document) and a high concentration region (referred to as n+offset drain region 17 in this patent Document) as drain regions. A gate oxide film 14 is formed so as to cover a channel formation region and an end of the low concentration drain region 12. A field oxide film 13 is formed in a region within the low concentration drain region 12 in which neither of the high concentration drain region 17 and the gate oxide film 14 is formed. A gate electrode 15 is formed so as to cover the gate oxide film 14 and an end section of the field oxide film 13. That is to say, the drain side end section of the gate electrode 15 is arranged on the field oxide film 13, not on the gate oxide film 14.

The drain region has a dual structure including the high concentration region 17 and the low concentration region 12, in order to improve the breakdown voltage between the source and the drain. If the distance of the low concentration region 12 is greater, that is, the distance between the channel formation region and the high concentration region 17 is greater, the breakdown voltage between the source and the drain can be improved.

Moreover, the reason the drain side end section of the gate electrode 15 is arranged on the field oxide film 13 is because an electric field is likely to concentrate in the vicinity of the end section of the gate electrode 15. That is to say, by arranging the end section of the gate electrode 15 on the field oxide film 13, electric field concentration within the drain region can be reduced, and the breakdown voltage of the MOS transistor increased.

As described above, in order to increase the breakdown voltage of the MOS transistor, it is preferable to increase the distance of the low concentration region, that is, to increase the distance between the channel formation region and the high concentration region.

However, there is a disadvantage in that if the distance of the low concentration region becomes greater, the on-resistance increases and the driving capacity of the MOS transistor decreases.

In addition, there is also a disadvantage in that when the distance of the low concentration region is made greater, the element area increases and integration of an integrated circuit decreases.

Here, even when the distance of the low concentration region is made greater, if the channel width is accordingly increased, an increase in the on-resistance can be prevented or suppressed. However, if the channel width of the MOS transistor is increased, the element area further increases and the problem of integration decrease becomes more significant.

OBJECTS OF THE INVENTION

An object of the present invention is to provide a high voltage field effect transistor for which the on-resistance is low and the element area is small.

Another object of the present invention is to provide a manufacturing method of a high voltage field effect transistor in which the on-resistance is low and the element area is small.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A high voltage field effect transistor according to a first aspect of the present invention includes: a p-type low concentration drain region and a low concentration source region formed on both sides of a channel formation region within a n-type region of a semiconductor substrate; a high concentration drain region formed in the low concentration drain region, an impurity concentration of which is higher than that of the low concentration drain region; a gate insulating film that at least covers a surface of the channel formation region; a field oxide film formed on the low concentration drain region so as to be in contact with an end section of the gate insulating film; a gate electrode formed on said gate insulating film and at least a part of said field oxide film so as to cover an entire channel formation region and an end section of said low concentration drain region; and a non-oxide region of the low concentration drain region, on both sides of which there are the gate electrode and the high concentration drain region, and on a surface of which there are not formed the high concentration drain region and the field oxide film.

According to the first aspect of the present invention, since the non-oxide region, on both sides of which there are the gate electrode and the high concentration drain region, and on a surface of which there are not formed the high concentration drain region and the field oxide film, is provided in the low concentration drain region, then at this time of manufacture, the phenomena where the p-type impurity within the low concentration drain region is absorbed in the field oxide film can be suppressed. As a result, the p-type impurity concentration within the low concentration drain region can be maintained at a high level. Consequently, a sufficiently low on-resistance can be obtained without increasing the element area of the high voltage field effect transistor.

A second aspect of the present invention relates to a manufacturing method of a high voltage field effect transistor including: a p-type low concentration drain region and a low concentration source region formed on both sides of a channel formation region within a n-type region of a semiconductor substrate; a high concentration drain region formed in the low concentration drain region, an impurity concentration of which is higher than that of the low concentration drain region; a gate insulating film that covers at least a surface of the channel formation region; a field oxide film formed on the low concentration drain region so as to be in contact with an end section of the gate insulating film; a gate electrode formed on said gate insulating film and at least a part of said field oxide film so as to cover an entire channel formation region and an end section of said low concentration drain region; and a non-oxide region of the low concentration drain region, on both sides of which there are the gate electrode and the high concentration drain region, and on a surface of which there are not formed the high concentration drain region and the field oxide film.

The second aspect of the present invention includes: a first step for forming the low concentration drain region and the low concentration source region within the n-type region of the semiconductor substrate; a second step for forming the field oxide film on the surface of the semiconductor substrate; a third step for forming the gate insulating film and the gate electrode in this order; a fourth step for forming a mask pattern that at least covers a portion, which will become the non-oxide region, and the gate electrode; and a fifth step for forming the high concentration drain region by implanting a p-type impurity using the mask pattern. After the above fifth step, a sixth step for forming a p-type low resistance layer, the impurity concentration of which is higher than that of the low concentration drain region, and lower than that of the high concentration drain region, in the non-oxide region, may be further included.

According to the second aspect of the present invention, the mask pattern that at least covers the portion, which will become the non-oxide region, and the gate electrode is formed (fourth step), and then the high concentration drain region is formed by implanting a p-type impurity using this mask pattern (fifth step). Therefore, the non-oxide region can be formed between the gate electrode and the high concentration drain region.

BRIEF DESCRIPTION OF THE REFERENCE SYMBOLS

Figure 1:
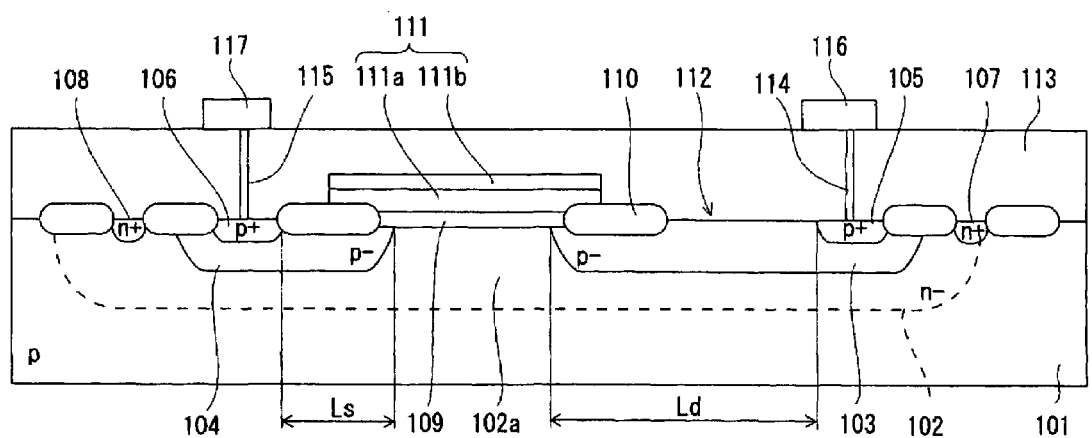
FIG. 1 is a sectional view schematically showing a structure of a high voltage pMOS transistor according to a first embodiment.

100 High voltage pMOS transistor
101 Semiconductor substrate
102 n-well
103 Low concentration drain region
104 Low concentration source region
105 High concentration drain region
106 High concentration source region
107, 108 Guard ring layer
109 Gate oxide film
110 Field oxide film
111 Gate electrode
112 Non-oxide region
113 Intermediate insulating film
114, 115 Contact layer
116, 117 Wiring pattern

DISCLOSURE OF THE INVENTION

In the following detailed description of the preferred embodiments, reference is made to the accompanying drawings which form a part hereof, and in which is shown by way of illustration specific preferred embodiments in which the invention may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present invention is defined only by the appended claims.

Hereunder, preferred embodiments of the present invention are described, with reference to the drawings. The size, shape, and positional relationship of the respective components are shown only schematically for allowing sufficient understanding of the present invention, and furthermore, numerical conditions described below are simply examples only.

FIRST PREFERRED EMBODIMENT

Figure 2A:
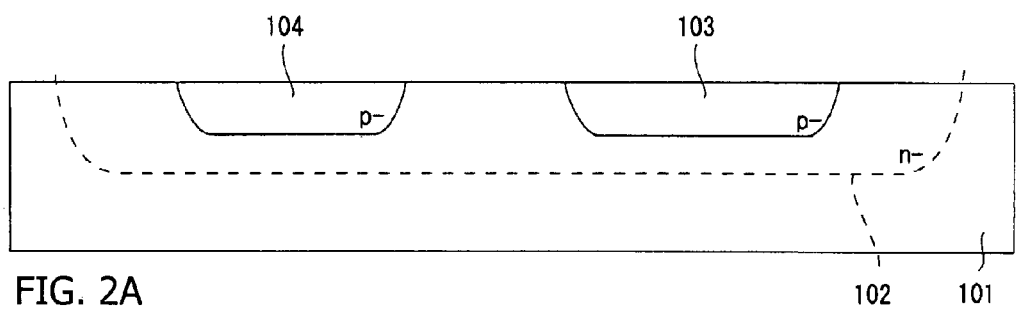
FIG. 2 is a process sectional view schematically showing manufacturing steps according to the first embodiment.
Figure 2B:
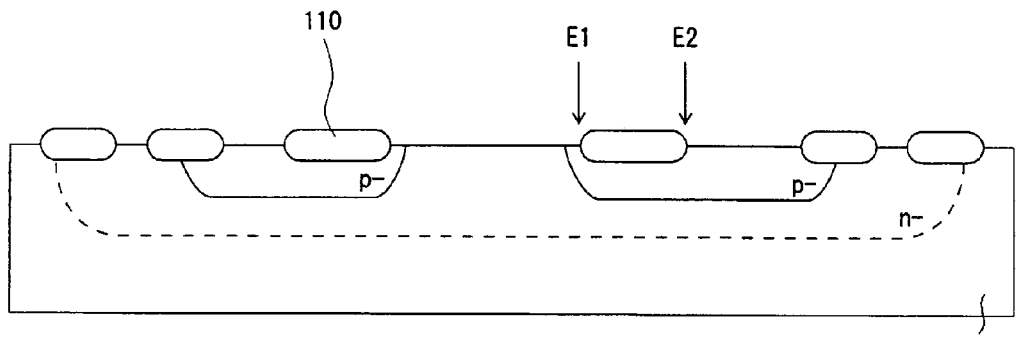
Figure 2C:
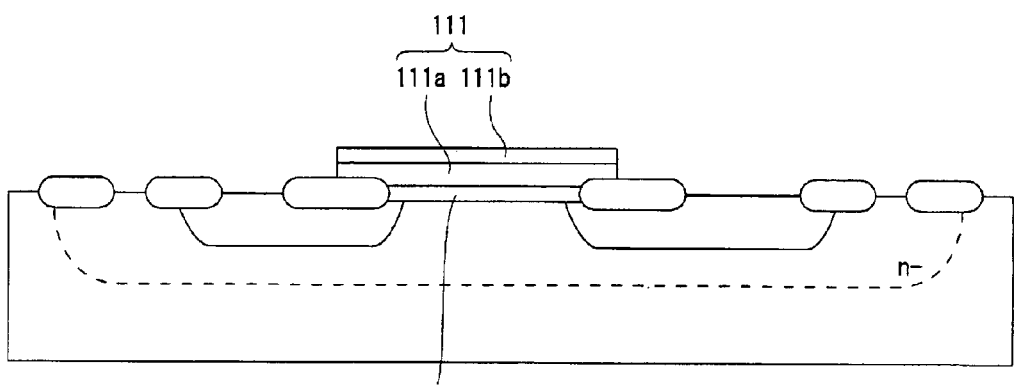
Figure 3A:
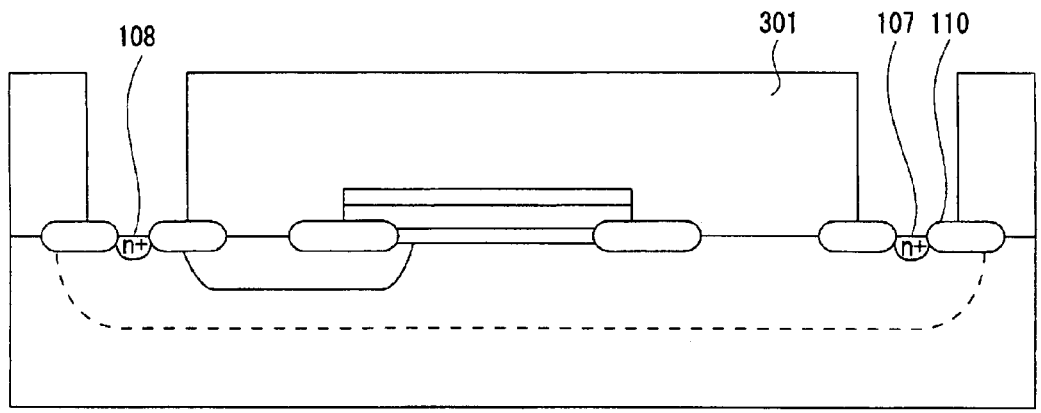
FIG. 3 is a process sectional view schematically showing manufacturing steps according to the first embodiment.
Figure 3B:
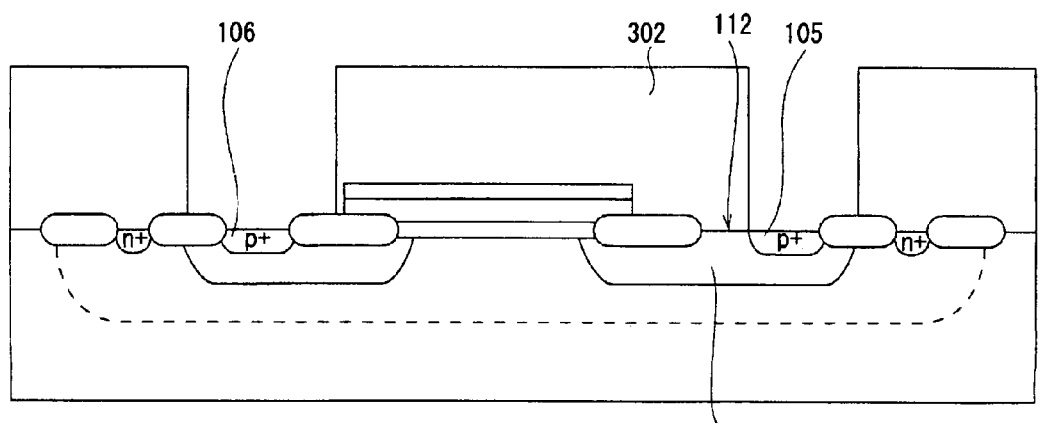

A high voltage field effect transistor according to a first preferred embodiment, and a manufacturing method thereof are described, with reference to FIG. 1 through FIG. 3.

FIG. 1 is a cross-sectional view schematically showing a structure of a high voltage pMOS transistor according to the present embodiment.

As shown in FIG. 1, a high voltage pMOS transistor 100 of the present embodiment has: a low concentration drain region 103; a low concentration source region 104; a high concentration drain region 105; a high concentration source region 106; guard ring layers 107 and 108; a gate oxide film 109; a field oxide film 110; a gate electrode 111; a non-oxide region 112; an intermediate insulating film 113; contact layers 114 and 115; and wiring patterns 116 and 117, all of which are formed on a n-well 102 of a semiconductor substrate 101.

As a semiconductor substrate 101, a p-type silicon substrate can be used.

The n-well 102 is formed by implanting ions of a n-type impurity such as phosphorus into the surface of the semiconductor substrate 101. The impurity concentration of the n-well 102 is for example $1 \times 10^{16}$ cm$^{-3}$.

The low concentration drain region 103 and the low concentration source region 104 are formed by implanting ions of an impurity such as boron into the n-type region 102 of the semiconductor substrate 101. The impurity concentration of the low concentration drain region 103 and the low concentration source region 104 is for example $1 \times 10^{16}$ cm$^{-3}$. A region between the low concentration drain region 103 and the low concentration source region 104 is a channel formation region 102a.

The high concentration drain region 105 is formed within the low concentration drain region 103. The high concentration drain region 105 has an impurity concentration (for example, $1 \times 10^{20}$ cm$^{-3}$) higher than that of the low concentration drain region 103. The high concentration drain region 105 is formed in a position at which a distance Ld between it and the channel formation region 102a is for example no more than 10 µm.

The high concentration source region 106 is formed within the low concentration source region 104. The high concentration source region 106 has an impurity concentration (for example, $1\times10^{20}$ cm$^{-3}$) higher than that of the low concentration source region 104. The high concentration source region 106 is formed in a position at which a distance Ls between it and the channel formation region 102a is shorter than the distance Ld mentioned above.

The guard ring layers 107 and 108 are layers for electrically separating the high voltage pMOS transistor 100 from other adjacent elements. The guard ring layers 107 and 108 are formed by implanting ions of a n-type impurity into outside the low concentration drain region 103 and the low concentration source region 104. The impurity concentration of the guard ring layers 107 and 108 is for example $1\times10^{20}$ cm$^{-3}$.

The gate oxide film 109 is a silicon oxide film formed so as to at least cover the surface of the channel formation region 102a. The film thickness of the gate oxide film 109 is for example at least 200 nm and no more than 250 nm.

The field oxide film 110 is formed so as to be in contact with an end section of the gate oxide film 109 and so as to cover a portion of a region in which the low concentration drain region 103 is formed, not covering the portion of the high concentration drain region 105 and the non-oxide region 112. Furthermore, the field oxide film 110 of the present embodiment covers a region in which the low concentration source region 104 is formed, other than the region of the high concentration source region 106. The film thickness of the field oxide film 110 is for example no more than 800 nm. Moreover, the field oxide film 110 is formed so that the length thereof from the gate oxide film 109 side end section to the non-oxide region 112 side end section is at least 1.5 µm and no more than 3.0 µm.

The gate electrode 111 is formed so as to cover the entire surface of the channel formation region 102a via the gate oxide film 109, and so as to cover end sections of the low concentration drain region 103 and the low concentration source region 104 via the field oxide film 110. The structure of the gate electrode 111 is arbitrary. However, in the present embodiment, a gate electrode having a laminated structure of a polysilicon layer 111a and a tungsten silicide layer 111b is used.

The non-oxide region 112 intervenes between the gate electrode 111 and the high concentration drain region 105 of the low concentration drain region 103, and it is a region on the surface of which these high concentration drain region 105 and the field oxide film 110 are not formed. In the present embodiment, by providing the non-oxide region 112 on the surface of the low concentration drain region 103 (specifically, by providing a region not covered by the field oxide film 110, on the surface of the low concentration drain region 103), an increase in on-resistance can be suppressed without increasing the element area of the high voltage pMOS transistor (described later).

The intermediate insulating film 113 is formed for example by covering the entire surface of the semiconductor substrate 101 with a silicon oxide film.

The contact layers 114 and 115 are interlayer wirings for electrically connecting the high concentration drain region 105 and the high concentration source region 106 to the wiring patterns 116 and 117. The contact layers 114 and 115 are formed by filling, for example, tungsten into contact holes formed in the intermediate insulating film 113.

The wiring patterns 116 and 117 are conductive layers for providing wiring on the high concentration drain region 105 and the high concentration source region 106, and are formed for example from aluminum.

Next, a manufacturing method of the high voltage pMOS transistor shown in FIG. 1 is described. FIG. 2 and FIG. 3 are process sectional views schematically showing manufacturing steps according to the present embodiment.

(1) First, the n-well 102 is formed on the surface of the semiconductor substrate 101 by implanting ions of a n-type impurity such as phosphorous with a maximum dosage of approximately $1\times10^{13}$ cm$^{-2}$ for example. Then ions of a p-type impurity such as boron with a maximum dosage of approximately $1\times10^{13}$ cm$^{-2}$, for example, are injected into this n-well 102, to thereby form the low concentration drain region 103 and the low concentration source region 104 (refer to FIG. 2A).

(2) Next, the field oxide film 110, the thickness of which is for example no more than 800 nm, is formed on the surface of the semiconductor substrate 101 by means of a LOCOS (localized oxidation of silicon) method for example. The field oxide film 110 is not formed in the regions in which the high concentration drain region 105, the high concentration source region 106, the guard ring layers 107 and 108, and the gate oxide film 109 are formed, and in the region that will be the non-oxide region 112. As described above, in the present embodiment, the field oxide film 110 is formed so that the length from an end section E1 on a side of the region where the gate oxide film 109 is to be formed to an end section E2 of a region that will be the non-oxide region 112 is at least 1.5 µm and no more than 3.0 µm (refer to FIG. 2B).

(3) An oxide film, the thickness of which is no more than 250 nm for example, is formed by oxidizing the surface of the semiconductor substrate 101 by means of thermal oxidation for example, and subsequently, the gate oxide film 109 is formed by selectively etching the oxide film on the region other than the channel formation region 102a, using a resist pattern. Furthermore, using a standard ion implantation technique, ion implantation into the channel formation region 102a for adjusting the threshold value voltage is performed. Then, using a standard thin film laminating technique for example, the polysilicon layer 111a and the tungsten silicide layer 111b are formed on the gate oxide film 109. As a result, the gate electrode 111 is completed (refer to FIG. 2C).

(4) Subsequently, using a standard photolithography technique or the like, a resist mask 301 is formed. The resist mask 301 exposes only regions in which the guard ring layers 107 and 108 are formed and the field oxide film 110 around these regions, and it covers other regions. Then arsenic ions with a maximum dosage of $1\times10^{16}$ cm$^{-2}$ for example, are implanted using the resist mask 301, to thereby form the guard ring layers 107 and 108 (refer to FIG. 3A). Subsequently the resist mask 301 is removed.

(5) Next, using a standard photolithography technique or the like, a resist mask 302 is formed. The resist mask 302 exposes only regions in which the high concentration drain region 105 and the high concentration source region 106 are formed, and the field oxide film 110 around these regions, and it covers other regions. Then for example BF2 ions with a maximum dosage of approximately $5\times10^{15}$ cm$^{-2}$ are implanted using the resist mask 302, to thereby form the high concentration drain region 105 and the high concentration source region 106 (refer to FIG. 3B). Subsequently the resist mask 302 is removed. As described above, in the present embodiment, since the exposed surface of the low concentration drain region 103 is covered by the resist mask 302, this exposed surface can be made into the non-oxide region 112.

(6) Lastly, the intermediate insulating film 113, the contact layers 114 and 115, and the wiring patterns 116 and 117 are formed using a standard deposition technique, photolithography technique or the like, and the high voltage pMOS transistor 100 as shown in FIG. 1 is completed.

Next, reasons why the on-resistance of the high voltage pMOS transistor according to the present embodiment becomes low are described.

When manufacturing a high voltage MOS transistor, the impurity concentration in the low concentration drain region is determined in consideration of the on-resistance and the breakdown voltage of the transistor. In a transistor, the on-resistance can be made lower if the impurity concentration in the low concentration drain region is higher. In contrast, as the impurity concentration of the low concentration drain region becomes higher, a concentration gradient on a boundary surface between a well region and the low concentration drain region becomes steep, and the breakdown voltage of the transistor decreases. Therefore, in order to obtain a transistor with a sufficiently low on-resistance and a sufficiently high breakdown voltage, the impurity concentration of the low concentration drain region needs to be controlled at a high level of precision.

Here, in a conventional high voltage MOS transistor, a field oxide film is formed on the entire surface of a low concentration drain region except for a portion in which a high concentration drain region is formed and a portion in which a gate oxide film is formed (refer to the above patent Document 1).

However, in a p-type high voltage MOS transistor, when forming a field oxide film on the surface of the low concentration drain region, the p-type impurity in the low concentration drain region is taken into this field oxide film. For this reason, the impurity concentration in the vicinity of the surface of the low concentration drain region (that is to say in the vicinity of the boundary surface of the low concentration drain region and the field oxide film) decreases and the on-resistance increases. In contrast, since the impurity concentration in a deep position of the low concentration drain region does not change, if the impurity concentration of the entire low concentration drain region is pre-set high, the breakdown voltage of the transistor becomes extremely low.

On the other hand, in the present embodiment, in the p-type high voltage MOS transistor, by providing a non-oxide region between a gate electrode and a high concentration drain region, the area of contact between a low concentration drain region and a field oxide film is kept small. Accordingly, a phenomenon of the p-type impurity within the low concentration drain region being absorbed in the field oxide film during manufacture can be suppressed. Therefore a decrease in the p-type impurity concentration within the low concentration drain region can be suppressed. Consequently, according to the present embodiment, a sufficiently low on-resistance can be obtained without increasing the element area and decreasing the breakdown voltage of the high voltage field effect transistor. As described above, in the present embodiment, the non-oxide region 112 is formed so that the distance from the end section of the non-oxide region 112 to the end section of the gate oxide film 109 (that is to say, the length of the field oxide film formed between these end sections) is at least 1.5 μm and no more than 3.0 μm. This is because, if this distance is no more than 1.5 μm, it becomes difficult to form the end section of the gate electrode 111 on the field oxide film 110, and moreover, if this distance is greater than 3.0 μm, the effect of suppressing an increase in the on-resistance is insufficient.

On the other hand, in a n-type high voltage MOS transistor, the n-type impurity moves into the vicinity of the surface of the low concentration drain region when forming the field oxide film. However, the n-type impurity is hardly taken into the field oxide film. Accordingly, since the on-resistance for the entire transistor hardly increases, the non-oxide region need not be provided.

As described above, according to the high voltage pMOS transistor in the present embodiment, since the non-oxide region 112 is provided between the gate electrode 111 and the high concentration drain region 105, a sufficiently low on-resistance can be obtained without increasing the element area.

Furthermore, according to the manufacturing method of the high voltage pMOS transistor of the present embodiment, the mask pattern 302 that at least covers the portion which will be the non-oxide region 112, and the gate electrode 111 is formed and then the high concentration drain region 105 is formed by implanting a p-type impurity using this mask pattern 302 (refer to the step (5) mentioned above), and thereby the non-oxide region 112 can be formed between the gate electrode 111 and the high concentration drain region 105.

In the present embodiment, the case of forming the high concentration region 106 also within the low concentration source region 104 has been described as an example. However, also in the case of not forming the high concentration region 106, the present embodiment can be applied. Moreover, the present embodiment uses a configuration in which the field oxide film 110 covers the entire surface of the low concentration source region 104. However, even in the case of not forming the field oxide film on the low concentration source region 104 side, the present invention can be applied. That is to say, if the non-oxide region 112 is provided on the low concentration drain region 103, the effects of the present invention can be obtained regardless of the configuration on the source side.

SECOND PREFERRED EMBODIMENT

Figure 4:
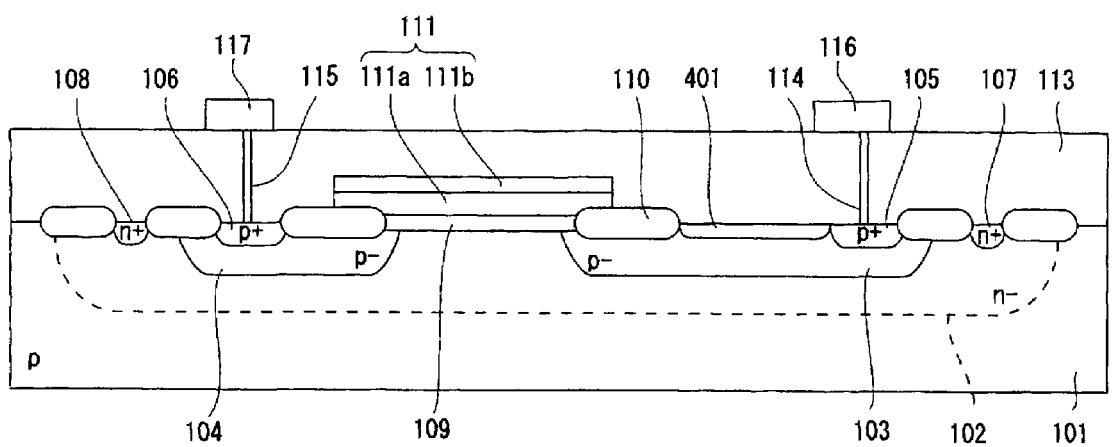
FIG. 4 is a sectional view schematically showing a structure of a high voltage pMOS transistor according to a second embodiment.

Next, a high voltage field effect transistor according to a second preferred embodiment, and a manufacturing method thereof are described, with reference to FIG. 4 and FIG. 5.

FIG. 4 is a sectional view schematically showing a structure of a high voltage pMOS transistor according to the present embodiment. In FIG. 4, the components having reference symbols the same as in FIG. 1 respectively denote the same components in FIG. 1.

As shown in FIG. 4, a high voltage PMOS transistor 400 in the present embodiment differs from the first embodiment described above in that a p-type low resistance layer 401 is provided on the surface of the non-oxide region 112.

The p-type low resistance layer 401 is formed in a position that corresponds to the non-oxide region 112 of the first embodiment. The impurity concentration of the p-type low resistance layer 401 is set to a value higher than that of the low concentration drain region 103 and lower than that of the high concentration drain region 105.

Next, a manufacturing method of the high voltage pMOS transistor shown in FIG. 4 is described. FIG. 5 is a process sectional view schematically showing manufacturing steps according to the present embodiment.

Figure 5A:
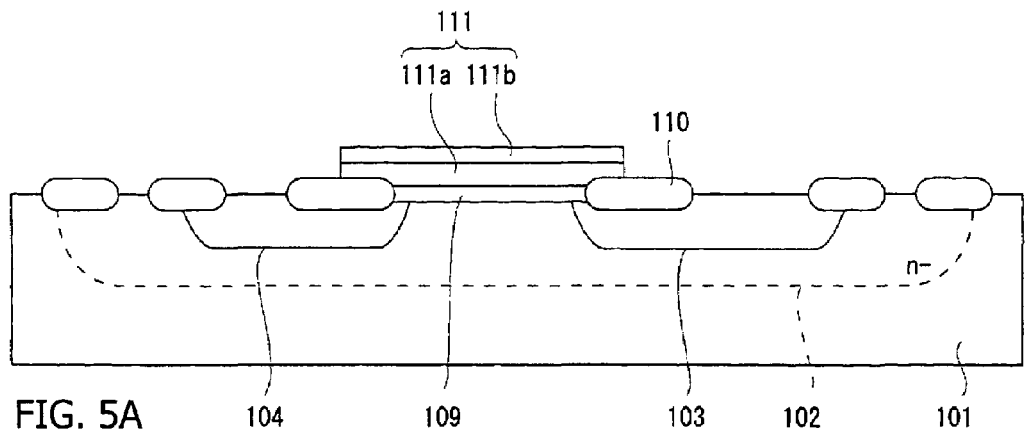
FIG. 5 is a process sectional view schematically showing ring steps according to the second embodiment.

(1) First, as with the steps (1) to (3) of the first embodiment, a n-well 102, a low concentration drain region 103, a low concentration source region 104, a gate oxide film 109, a field oxide film 110, and a gate electrode 111 are formed on the surface of a semiconductor substrate 101 (refer to FIG. 5A).

Figure 5B:
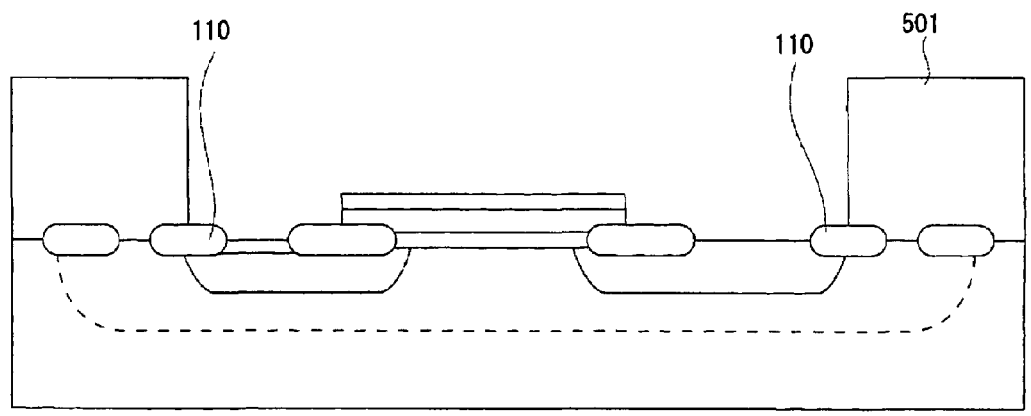

(2) Next, using a standard photolithography technique or the like, a resist mask 501 is formed. The resist mask 501 is formed so as to cover regions in which the guard ring layers 107 and 108 are formed, and the field oxide film 110 around these regions (FIG. 5B).

Figure 5C:
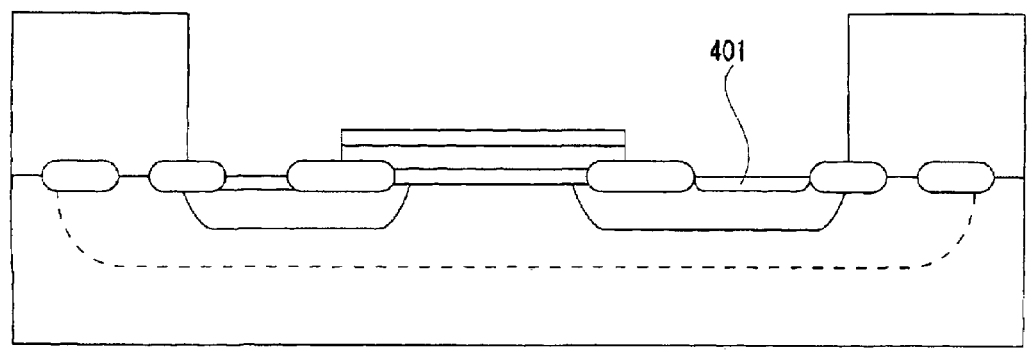

(3) Subsequently, using the resist mask 501, the p-type low resistance layer 401 is formed for example by implanting BF2 ions with a maximum dosage of approximately $1 \times 10^{13}$ cm$^{-2}$ (refer to FIG. 5C). When manufacturing the high voltage pMOS transistor 400 and a low voltage transistor (specifically LV-MOS transistor) at the same time, the p-type low resistance layer 401 may be formed at the same time as ion implantation for forming a LDD (Lightly Doped Drain) region of the LV-MOS transistor.

(4) Then, as with the steps (4) to (6) of the first embodiment, the guard ring layers 107 and 108, the high concentration drain region 105, a high concentration source region 106, an intermediate insulating film 113, contact layers 114 and 115, and wiring patterns 116 and 117 are formed, and the high voltage pMOS transistor 400 as shown in FIG. 4 is completed.

As described above, according to the high voltage pMOS transistor of the present embodiment, since there is provided the low resistance layer 401, the on-resistance can be lowered even further than for the first embodiment.

What is claimed is:

1. A high voltage field effect transistor comprising:
   a p-type low concentration drain region and a low concentration source region formed on both sides of a channel formation region within a n-type region of a semiconductor substrate;
   a high concentration drain region formed in said low concentration drain region, an impurity concentration of which is higher than that of said low concentration drain region;
   a gate insulating film that at least covers a surface of said channel formation region;
   a field oxide film formed on said low concentration drain region so as to be in contact with an end section of said gate insulating film;
   a gate electrode formed on said gate insulating film and at least a part of said field oxide film so as to cover an entire channel formation region and an end section of said low concentration drain region; and
   a non-oxide region of said low concentration drain region, located between said gate electrode and said high concentration drain region, the non-oxide region being on a surface different from said high concentration drain region and said field oxide film.

2. A high voltage field effect transistor according to claim 1, wherein a length of said field oxide film from said gate insulating film side end section to said non-oxide region side end section is at least 1.5 μm and no more than 3.0 μm.

3. A high voltage field effect transistor according to claim 1, wherein a p-type low resistance layer, the impurity concentration of which is higher than that of said low concentration drain region, and lower than that of said high concentration drain region, is formed in said non-oxide region.

4. A high voltage field effect transistor according to claim 1, wherein
   a high concentration source region, the impurity concentration of which is higher than that of said low concentration source region, is formed in said low concentration source region, and
   a region of said low concentration source region where said high concentration source region is not formed, is covered by said field oxide film.

5. A high voltage field effect transistor according to claim 1, wherein a distance from said channel formation region to said high concentration drain region is longer than a distance from said channel formation region to said high concentration source region.

6. A high voltage field effect transistor according to claim 1, wherein a film thickness of said gate insulating film is at least 200 nm and no more than 250 nm.

* * * * *